US012763143B2

(12) United States Patent
Chiang

(10) Patent No.: US 12,763,143 B2
(45) Date of Patent: Oct. 13, 2026

(54) CONTENT-ADDRESSABLE MEMORY AND MEMORY CONTROL METHOD

(71) Applicant: REALTEK SEMICONDUCTOR CORPORATION, Hsinchu (TW)

(72) Inventor: I-Hao Chiang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 93 days.

(21) Appl. No.: 18/921,059

(22) Filed: Oct. 21, 2024

(65) Prior Publication Data

US 2025/0149089 A1 May 8, 2025

(30) Foreign Application Priority Data

Nov. 7, 2023 (TW) ................................ 112142918

(51) Int. Cl.
*G11C 15/00* (2006.01)
*H03K 19/20* (2006.01)

(52) U.S. Cl.
CPC .............. *G11C 15/00* (2013.01); *H03K 19/20* (2013.01)

(58) Field of Classification Search
CPC ........ G11C 15/00; G11C 15/04; H03K 19/20; Y02D 10/00
See application file for complete search history.

(56) References Cited

U.S. PATENT DOCUMENTS

| | | | | |
|---|---|---|---|---|
| 6,958,925 B1 * | 10/2005 | Om | G11C 15/00 365/49.17 |
| 11,244,724 B2 | 2/2022 | Chiang | |
| 2015/0235701 A1 | 8/2015 | Iyengar | |
| 2016/0148688 A1 * | 5/2016 | Barth, Jr. | G11C 7/067 365/49.17 |

FOREIGN PATENT DOCUMENTS

TW I713051 12/2020

OTHER PUBLICATIONS

OA letter of a counterpart TW application (appl. No. 112142918) mailed on Oct. 15, 2024.

* cited by examiner

*Primary Examiner* — Woo H Choi
(74) *Attorney, Agent, or Firm* — WPAT, PC

(57) ABSTRACT

A content-addressable memory includes a pre-search content-addressable memory array, a control circuit, and a main search content-addressable memory array. The pre-search content-addressable memory array is configured to perform a first data search to selectively adjust levels of a plurality of match lines in the pre-search content-addressable memory array. The control circuit is configured to generate a detection signal according to the levels of the plurality of match lines after the first data search is performed, and to generate an enable signal according to the detection signal. The main search content-addressable memory array is configured to selectively perform a second data search according to the enable signal.

18 Claims, 8 Drawing Sheets

CONTENT-ADDRESSABLE MEMORY AND MEMORY CONTROL METHOD

BACKGROUND OF THE INVENTION

1. Field of the Invention

The present disclosure relates to a content-addressable memory and a memory control method thereof that may save power consumption based on data search results.

2. Description of Related Art

A content-addressable memory may quickly compare stored data with data to be searched and output the comparison results. In content-addressable memory applications, the main power consumption comes from charging and discharging the match lines and the search bit-lines. However, in existing approaches, the control mechanism of content-addressable memory is generally employed to reduce the power consumption caused by charging and discharging the match lines, but fails to reduce the power consumption caused by charging and discharging the search bit-lines.

SUMMARY OF THE INVENTION

In some aspects of the present disclosure, one of the objectives of the present disclosure is, but not limited to, to provide a content-addressable memory and a memory control method thereof that may save power consumption based on data search results (especially corresponding to the power consumption caused by the search bit lines), so as to improve the deficiencies of the prior art.

In some aspects of the present disclosure, a content-addressable memory includes a pre-search content-addressable memory array, a control circuit, and a main search content-addressable memory array. The pre-search content-addressable memory array is configured to perform a first data search to selectively adjust levels of a plurality of match lines in the pre-search content-addressable memory array. The control circuit is configured to generate a detection signal according to the levels of the plurality of match lines after the first data search is performed, and to generate an enable signal according to the detection signal. The main search content-addressable memory array is configured to selectively perform a second data search according to the enable signal.

In some aspects of the present disclosure, a memory control method includes the following operations: performing, by a pre-search content-addressable memory array, a first data search to selectively adjust levels of the plurality of match lines in the pre-search content-addressable memory array; generating a detection signal according to the levels of the plurality of match lines after the first data search is performed, and generating an enable signal according to the detection signal; and selectively performing a second data search by a main search content-addressable memory array according to the enable signal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term “coupled” may also be termed as “electrically coupled,” and the term “connected” may be termed as “electrically connected.” “Coupled” and “connected” may mean “directly coupled” and “directly connected” respectively, or “indirectly coupled” and “indirectly connected” respectively. “Coupled” and “connected” may also be used to indicate that two or more elements cooperate or interact with each other. In this document, the term “circuitry” may indicate a system formed with at least one circuit, and the term “circuit” may indicate an object, which is formed with one or more transistors and/or one or more active/passive elements based on a specific arrangement, for processing signals.

As used herein, the term “and/or” includes any and all combinations of one or more of the associated listed items. Although the terms “first,” “second,” etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
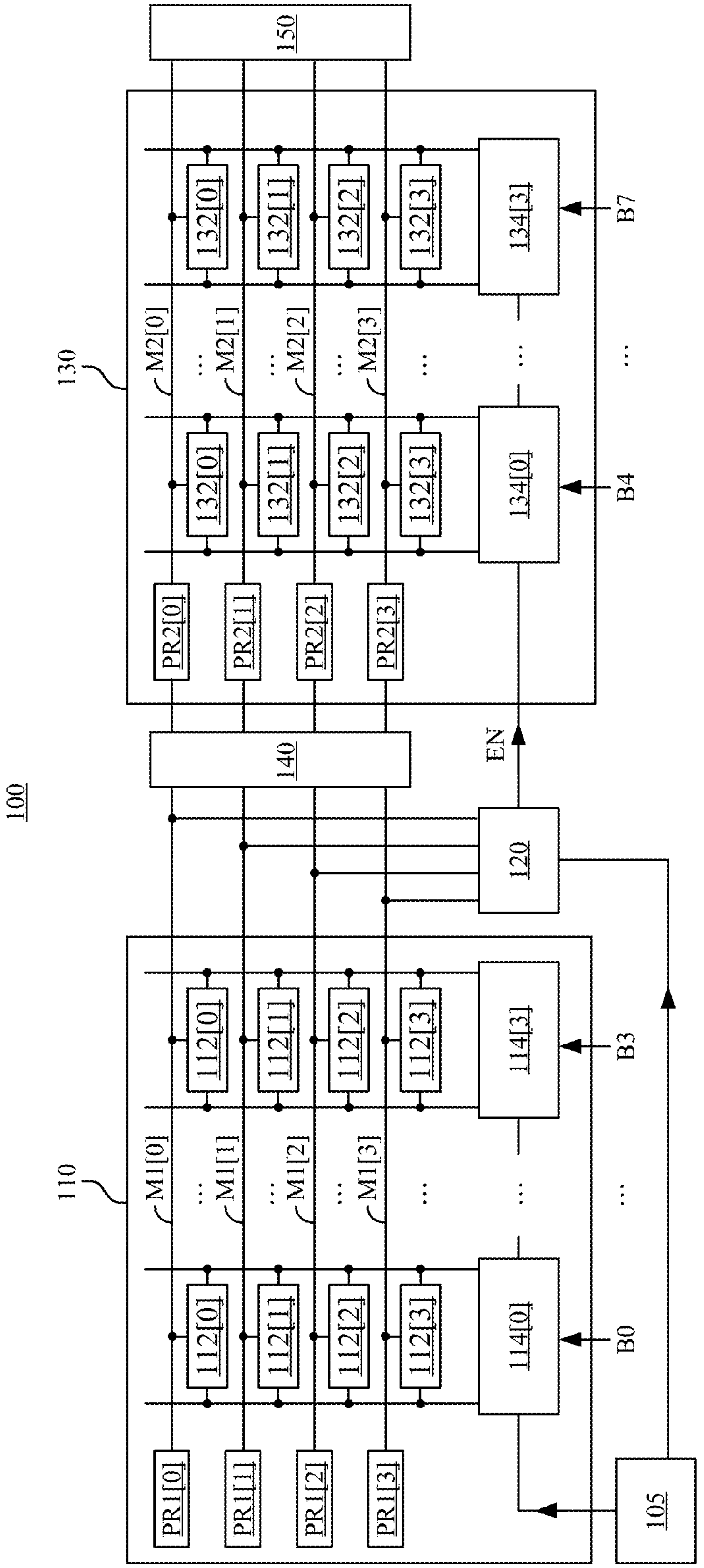
FIG. 1 illustrates a schematic diagram of a content-addressable memory according to some embodiments of the present disclosure.

FIG. 1 illustrates a schematic diagram of a content-addressable memory 100 according to some embodiments of the present disclosure. The content-addressable memory 100 includes a pre-search content-addressable memory array 110, a control circuit 120, a main search content-addressable memory array 130, a driver circuit 140, and a sense amplifier circuit 150.

The pre-search content-addressable memory array 110 may perform a first data search according to search data (which may include bits B0-B7) to determine whether a portion of the bits in the search data (e.g., bits B0-B3) match (i.e., are identical to) the data in the pre-search content-addressable memory array 110. In greater detail, the pre-search content-addressable memory array 110 may include match lines M1[0]-M1[3], content-addressable memory cells 112[0]-112[3], precharge circuits PR1[0]-PR1[3], and peripheral circuits 114[0]-114[3]. The content-addressable memory cells 112[0]-112[3] are respectively coupled to the precharge circuits PR1[0]-PR1[3] through the match lines M1[0]-M1[3], and are respectively coupled to the peripheral circuits 114[0]-114[3] through search bit-lines. Each of the content-addressable memory cells 112[0]-112[3] may store a corresponding bit in a word. For example, the content-addressable memory cells 112[0] may respectively store different bits in a first word, and the content-addressable memory cells 112[1] may respectively store different bits in a second word. With this analogy, the arrangement and connection relationships between the above components can be understood.

The precharge circuits PR1[0]-PR1[3] may charge the match lines M1[0]-M1[3] before performing the first data search, in order to pull up levels of the match lines M1[0]-M1[3] to a predetermined high level. The peripheral circuits 114[0]-114[3] may perform the first data search based on a clock signal provided from a timing controller circuit 105 in the system and the bits B0-B3 in the search data. For example, the peripheral circuit 114[0] may receive the bit B0 based on the clock signal to adjust the levels of the two search bit-lines coupled to the peripheral circuit 114[0]. In response to the levels of these two search bit-lines, the content-addressable memory cells (e.g., the content-addressable memory cells 112[0]-112[3] in the first column) coupled to these two search bit-lines may perform the first data search to determine whether the bit B0 matches the stored data. If the bit B0 matches the stored data, the levels of the match lines M1[0]-M1[3] will remain at the predetermined high level. Alternatively, if the bit B0 does not match the stored data, the level of the corresponding one of the match lines M1[0]-M1[3] will be pulled down to a low level (e.g., but not limited to, ground level). For example, if the bit B0 is different from the data stored in the content-addressable memory cell 112[0] in the first column, the content-addressable memory cell 112[0] will discharge the match line M1[0], thereby pulling down the level of the match line M1[0] to the low level, in order to indicate that the result of the first data search is a mismatch. With the above operations, the pre-search content-addressable memory array 110 may perform the first data search to selectively adjust the levels of the match lines M1[0]-M1[3].

Figure 2:
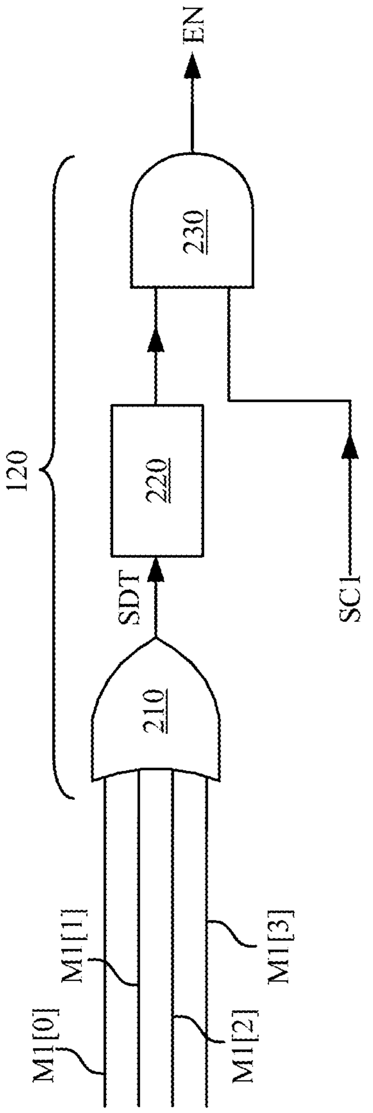
FIG. 2 illustrates a schematic diagram of the control circuit in FIG. 1 according to some embodiments of the present disclosure.
Figure 3:
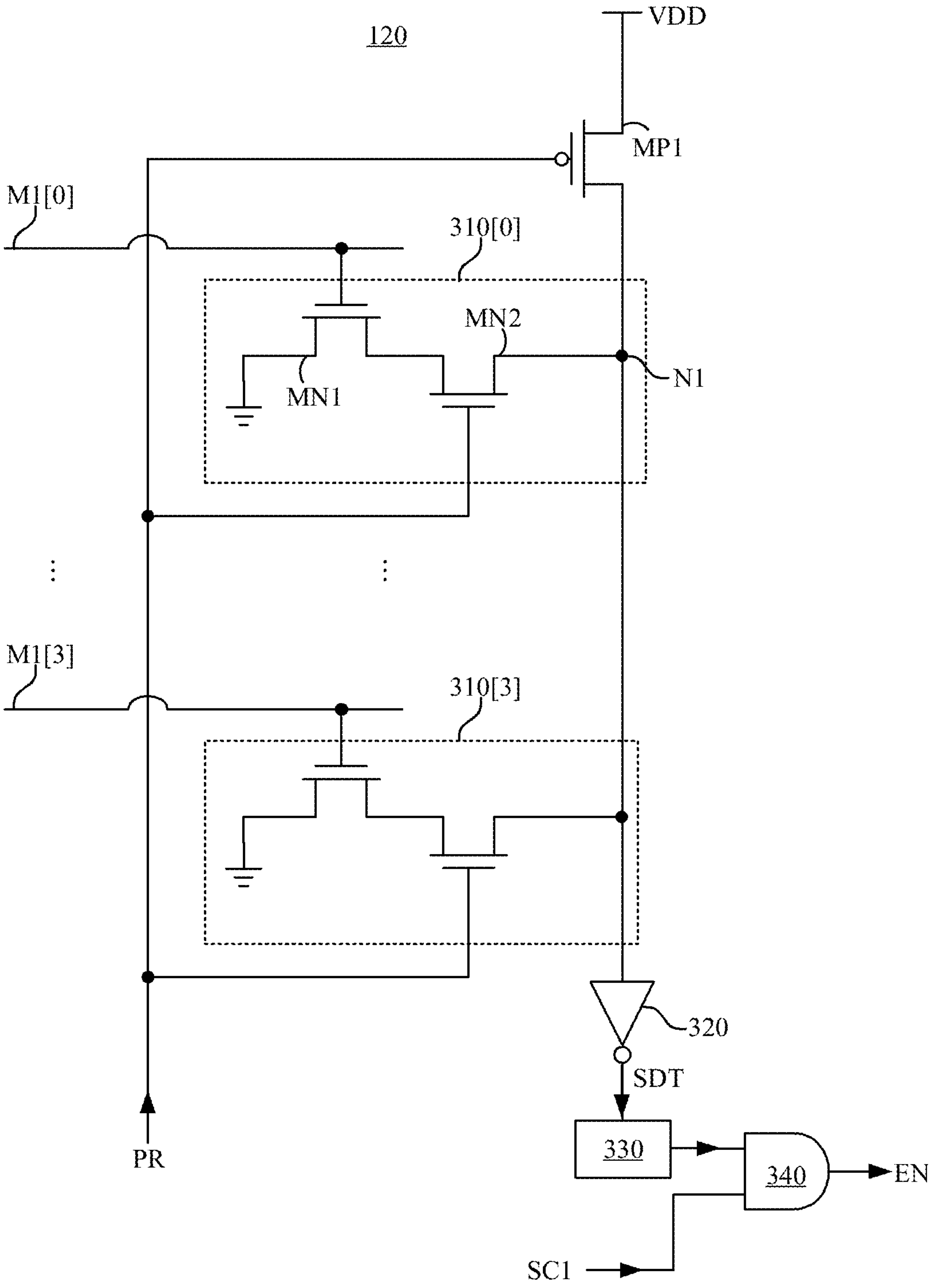
FIG. 3 illustrates a schematic diagram of the control circuit in FIG. 1 according to some embodiments of the present disclosure.
Figure 4:
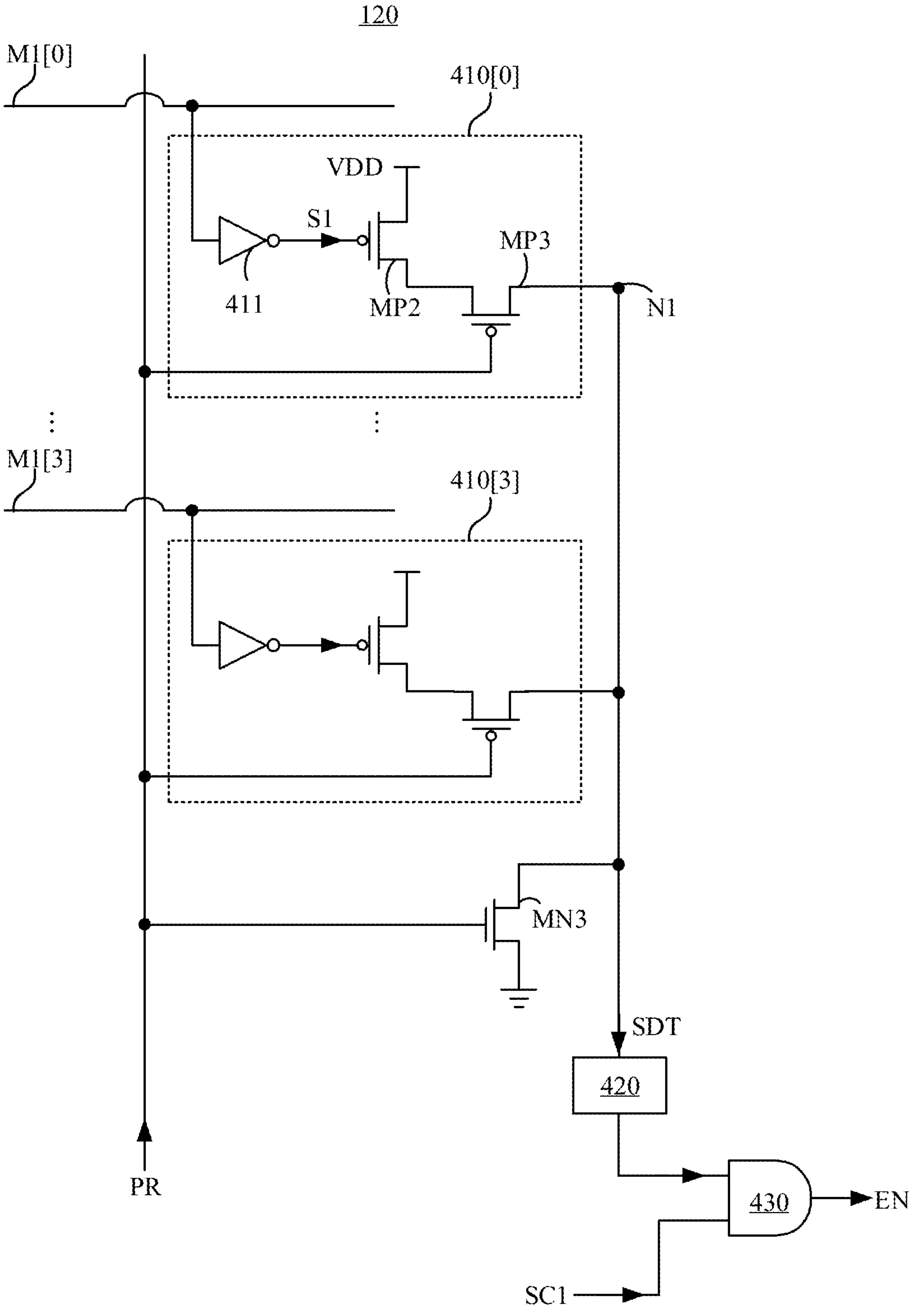
FIG. 4 illustrates a schematic diagram of the control circuit in FIG. 1 according to some embodiments of the present disclosure.

The control circuit 120 is coupled to the match lines M1[0]-M1[3], and after the first data search is performed, the control circuit 120 generates a detection signal (e.g., a detection signal SDT in FIG. 2, 3, or 4) according to the levels of the match lines M1[0]-M1[3], and generates an enable signal EN according to the detection signal SDT and at least one control signal from the timing controller circuit 105 (e.g., the control signals SC1 and/or reset signal PR in FIGS. 2, 3, and 4). In some embodiments, the control circuit 120 may determine whether to enable the main search content-addressable memory array 130 to perform a second data search (i.e., continue searching the remaining bits of the search data) in response to the result of the first data search. For example, if the levels of the match lines M1[0]-M1[3] are all low, it indicates that the result of the first data search is a mismatch. Under this condition, the control circuit 120 may generate the detection signal SDT with a predetermined logic value (which may be, for example but not limited to, a logic value of 0), thereby generating a corresponding enable signal EN to disable the circuits in the main search content-addressable memory array 130 that perform the second data search. Thus, the main search content-addressable memory array 130 does not perform the second data search, thereby reducing the overall power consumption of the content-addressable memory 100. Alternatively, if at least one of the match lines M1[0]-M1[3] is not at a low level, it indicates that the result of the first data search is a match. Under this condition, the control circuit 120 may generate the detection signal SDT with another logic value (which may be, for example but not limited to, a logic value of 1), thereby generating the corresponding enable signal EN to enable circuits in the main search content-addressable memory array 130 that perform the second data search, in order to continue searching the remaining bits of the search data. The configuration of the control circuit 120 will be described later with reference to other figures.

The driver circuit 140 is coupled between the pre-search content-addressable memory array 110 and the main search content-addressable memory array 130. In greater detail, the driver circuit 140 is coupled between the match lines M1[0]-M1[3] and the match lines (e.g., match lines M2[0]-M2[3]) in the main search content-addressable memory array 130. The driver circuit 140 may be configured to amplify signals on the match lines M1[0]-M1[3] and synchronously output the amplified signals to the main search content-addressable memory array 130. In some embodiments, the driver circuit 140 may include a sense amplifier circuit (not shown), a synchronous register circuit (not shown), and other circuits, but the present disclosure is not limited thereto.

The operation and configuration of the main search content-addressable memory array 130 are similar to those of the pre-search content-addressable memory array 110. The main search content-addressable memory array 130 may perform the second data search according to the search data and the enable signal EN to determine whether another portion of the bits in the search data (e.g., bits B4-B7) match the data stored in the main search content-addressable memory array 130. Similarly, the main search content-addressable memory array 130 may include match lines M2[0]-M2[3], content-addressable memory cells 132[0]-132[3], precharge circuits PR2[0]-PR2[3], and peripheral circuits 134[0]-134[3]. The content-addressable memory cells 132[0]-132[3] are respectively coupled to the precharge circuits PR2[0]-PR2[3] through the match lines M2[0]-M2[3], and are respectively coupled to the peripheral circuits 134[0]-134[3] through search bit-lines. The precharge circuits PR2[0]-PR2[3] may charge the match lines M2[0]-M2[3], in order to pull up the levels of the match lines M2[0]-M2[3] to the predetermined high level. The peripheral circuits 134[0]-134[3] may perform the second data search according to the bits B4-B7 in the search data and the enable signal EN. If the result of the first data search is a mismatch, the peripheral circuits 134[0]-134[3] may be not enabled according to the enable signal EN, thereby not performing the second data search. Thus, the levels of the search bit-lines in the main search content-addressable memory array 130 will not change (i.e., the search bit-lines will not be charged or discharged), thereby saving overall power consumption. Alternatively, if the result of the first data search is a match, the peripheral circuits 134[0]-134[3] may be enabled according to the enable signal EN to start performing the second data search. The sense amplifier circuit 150 is coupled to the match lines M2[0]-M2[3] and generates a signal according to the levels of the match lines M2[0]-M2[3] to indicate the search results of the search data.

FIG. 2 illustrates a schematic diagram of the control circuit 120 in FIG. 1 according to some embodiments of the present disclosure. In this example, the control circuit 120 includes a logic gate circuit 210, a synchronous register circuit 220, and a logic gate circuit 230. The logic gate circuit 210 is configured to generate the detection signal SDT according to the levels of the match lines M1[0]-M1[3]. The synchronous register circuit 220 may output the detection signal SDT to the logic gate circuit 230 in synchronization with the system timing. In some embodiments, the synchronous register circuit 220 may be implemented with one or more latch or flip-flop circuits, but the present disclosure is not limited thereto. The logic gate circuit 230 is configured to generate the enable signal EN according to the detection signal SDT and the control signal SC1 from the timing controller circuit 105 in FIG. 1.

In some embodiments, the logic gate circuit 210 may be, but is not limited to, an OR gate circuit. In some embodiments, the logic gate circuit 230 may be, but is not limited to, an AND gate circuit. When the result of the first data search is a mismatch, the levels of the match lines M1[0]-M1[3] are all low. Under this condition, the logic gate circuit 210 may output the detection signal SDT with a first predetermined level (e.g., low level). In response to the detection signal SDT with the first predetermined level, the logic gate circuit 230 may generate the enable signal EN with a disable level (e.g., low level), such that the main search content-addressable memory array 130 does not perform the second data search. Alternatively, when the result of the first data search is a match, at least one of the match lines M1[0]-M1[3] is at a high level. Under this condition, the logic gate circuit 210 may output the detection signal SDT with a second predetermined level (e.g., high level). In response to the detection signal SDT with the second predetermined level, the logic gate circuit 230 may generate the enable signal EN with an enable level (e.g., high level), in order to control the main search content-addressable memory array 130 to perform the second data search.

FIG. 3 illustrates a schematic diagram of the control circuit 120 in FIG. 1 according to some embodiments of the present disclosure. In this example, the control circuit 120 further resets the level of the detection signal SDT according to the reset signal PR from the timing controller circuit 105 in FIG. 1 before performing the first data search. In some embodiments, the control circuit 120 includes a switch MP1, detection circuits 310 [0]-310 [3], an inverter circuit 320, a synchronous register circuit 330, and a logic gate circuit 340. A first terminal of the switch MP1 receives the voltage VDD, a second terminal of the switch MP1 is coupled to a node N1, and a control terminal of the switch MP1 receives the reset signal PR. The switch MP1 is configured to be turned on according to the reset signal PR to transmit the voltage VDD to the node N1. In this example, the switch MP1 may be implemented with a P-type transistor, but the present disclosure is not limited thereto. Each of the detection circuits 310 [0]-310 [3] has the same circuit configuration. Taking the detection circuit 310 [0] as an example, the detection circuit 310 [0] includes a switch MN1 and a switch MN2. In this embodiment, each of the switches MN1 and MN2 may be implemented with an N-type transistor, but the present disclosure is not limited thereto. A first terminal of the switch MN1 is coupled to ground, a second terminal of the switch MN1 is coupled to a first terminal of the switch MN2, and a control terminal of the switch MN1 is coupled to the match line M1 [0]. A second terminal of the switch MN2 is coupled to the node N1, and a control terminal of the switch MN2 receives the reset signal PR. The switch MN1 is configured to be turned on according to the level of the match line M1 [0], and the switch MN2 is configured to be turned on according to the reset signal PR to couple the node N1 to ground through the switch MN1.

By this analogy, the corresponding configurations of the detection circuits 310[1]-310[3] can be understood, and thus the repetitious descriptions are not given. The inverter circuit 320 generates the detection signal SDT according to the level of the node N1. The synchronous register circuit 330 outputs the detection signal SDT to the logic gate circuit 340 in synchronization with the system timing. The logic gate circuit 340 generates the enable signal EN according to the detection signal SDT and the control signal SC1 from the timing controller circuit 105 in FIG. 1. In some embodiments, the synchronous register circuit 330 may be implemented with one or more latch circuits and/or flip-flop circuits. In some embodiments, the logic gate circuit 340 may be, but not limited to, an AND gate circuit.

In this example, before the first data search starts, the reset signal PR is at a low level. During the first data search, the reset signal PR switches to a high level. Before the first data search starts, the levels of the match lines M1[0]-M1[3] will be precharged to a high level, and the switch MP1 is turned on in response to the reset signal PR with the low level, in order to transmit the voltage VDD to the node N1. Under this condition, the node N1 is reset to a high level. The inverter circuit 320 may generate the detection signal SDT with a low level accordingly, so that the logic gate circuit 340 generates the enable signal EN with a low level, in order to disable the main search content-addressable memory array 130 from performing the second data search. During the first data search, the switch MP1 is not turned on in response to the reset signal PR with the high level, and the switch MN2 is turned on in response to the reset signal PR with the high level. Under this condition, if the data search result corresponding to the match line M1[0] is a match, the level of the match line M1[0] remains at a high level to turn on the switch MN1, so that the node N1 may be coupled to ground through the switches MN1 and MN2 to discharge. Thus, the level of the node N1 will be pulled down to a low level, so that the inverter circuit 320 generates the detection signal SDT with a high level. Alternatively, if the data search result corresponding to the match line M1[0] is a mismatch, the level of the match line M1[0] will be at a low level, in order not to turn on the switch MN1, so that the level of node N1 remains at a high level, and the inverter circuit 320 may generate the detection signal SDT with a low level accordingly. By this analogy, if the results of the first data search corresponding to all the match lines M1[0]-M1[3] are mismatches, the level of node N1 will remain at a high level, so that the inverter circuit 320 generates the detection signal SDT with a low level to turn off (or disable) some circuits in the main search content-addressable memory array 130, in order to disabling the main search content-addressable memory array 130 from performing the second data search. Alternatively, if the data search result corresponding to at least one of the match lines M1[0]-M1[3] is a match, the level of node N1 will be pulled down to a low level, so that the inverter circuit 320 generates the detection signal SDT with a high level, in order to allow the main search content-addressable memory array 130 to perform the second data search. Compared with the configuration of FIG. 2, in some embodiments, the configuration of FIG. 3 may reduce more vertical wiring in the circuit layout, in order to save more layout space and be easier to implement.

FIG. 4 illustrates a schematic diagram of the control circuit 120 in FIG. 1 according to some embodiments of the present disclosure. In this example, the control circuit 120 further resets the level of the detection signal SDT according to the reset signal PR from the timing controller circuit 105 in FIG. 1 before performing the first data search. In some embodiments, the control circuit 120 includes a switch MN3, detection circuits 410[0]-410[3], a synchronous register circuit 420, and a logic gate circuit 430. A first terminal of the switch MN3 is coupled to the node N1, a second terminal of the switch MN3 is coupled to ground, and a control terminal of the switch MN3 receives the reset signal PR. The switch MN3 is configured to be turned on according to the reset signal PR to pull down the level of node N1 to ground. In this example, the switch MN3 may be implemented with an N-type transistor, but the present disclosure is not limited thereto. Each of the detection circuits 410[0]-410[3] has the same circuit configuration. Taking the detection circuit 410[0] as an example, the detection circuit 410[0] includes a switch MP2, a switch MP3, and an inverter circuit 411. The inverter circuit 411 is coupled to the match line M1[0] and is configured to generate a signal S1 according to the level of the match line M1[0]. In this embodiment, each of the switches MP2 and MP3 may be implemented with a P-type transistor, but the present disclosure is not limited thereto. A first terminal of the switch MP2 receives the voltage VDD, a second terminal of the switch MP2 is coupled to a first terminal of the switch MP3, and a control terminal of the switch MP2 receives the signal S1. A second terminal of the switch MP3 is coupled to the node N1, and a control terminal of the switch MP3 receives the reset signal PR. The switch MP2 is configured to be turned on according to the level of the match line M1[0] to transmit the voltage VDD to the switch MP3, and the switch MP3 is configured to be turned on according to the reset signal PR to transmit the voltage VDD to the node N1.

By this analogy, the corresponding configurations of the detection circuits 410[1]-410[3] can be understood, and thus the repetitious descriptions are not given. The synchronous register circuit 420 outputs the detection signal SDT to the logic gate circuit 430 in synchronization with the system timing. The logic gate circuit 430 generates the enable signal EN according to the detection signal SDT and the control signal SC1 from the timing controller circuit 105 in FIG. 1. In some embodiments, the synchronous register circuit 420 may be implemented with one or more latch circuits and/or flip-flop circuits, but the present disclosure is not limited thereto. In some embodiments, the logic gate circuit 430 may be an AND gate circuit, but the present disclosure is not limited thereto.

Different from FIG. 3, in this example, before the first data search starts, the reset signal PR is at a high level. During the first data search, the reset signal PR switches to a low level. Before the first data search starts, the levels of the match lines M1 [0]-M1 [3] will be precharged to a high level, and the switch MN3 is turned on in response to the high level of the reset signal PR to pull down the level of node N1 to ground. Under this condition, the node N1 is reset to a low level, such that the logic gate circuit 430 generates the enable signal EN with a low level. On the other hand, the inverter circuit 411 generates the signal S1 with a low level, such that the switch MP2 is turned on to transmit the voltage VDD to the switch MP3. The switch MP3 is not turned on in response to the high level of the reset signal PR. During the first data search, the reset signal PR switches to a low level. In response to the reset signal PR with the low level, the switch MN3 is not turned on, and the switch MP3 is turned on. Under this condition, if the data search result corresponding to the match line M1 [0] is a match, the level of the match line M1 [0] remains at a high level, such that node N1 is charged by receiving the voltage VDD through the switches MP2 and MP3. Thus, the level of the node N1 will rise to a high level to generate the detection signal SDT with the high level. Alternatively, if the data search result corresponding to the match line M1 [0] is a mismatch, the level of the match line M1 [0] will be at a low level, and the inverter circuit 411 generates the signal S1 with a high level to turn off the switch MP2. Thus, the node N1 cannot be charged by the voltage VDD and remains at a low level to generate the detection signal SDT with a low level. By this analogy, if the results of the first data search corresponding to all the match lines M1 [0]-M1 [3] are mismatches, the level of node N1 will remain at a low level to generate the detection signal SDT with the low level to turn off some circuits in the main search content-addressable memory array 130, thereby preventing the main search content-addressable memory array 130 from performing the second data search. Alternatively, if the data search result corresponding to at least one of the match lines M1 [0]-M1 [3] is a match, the level of node N1 will rise to a high level to generate the detection signal SDT with a high level, thereby allowing the main search content-addressable memory array 130 to perform the second data search.

Figure 5:
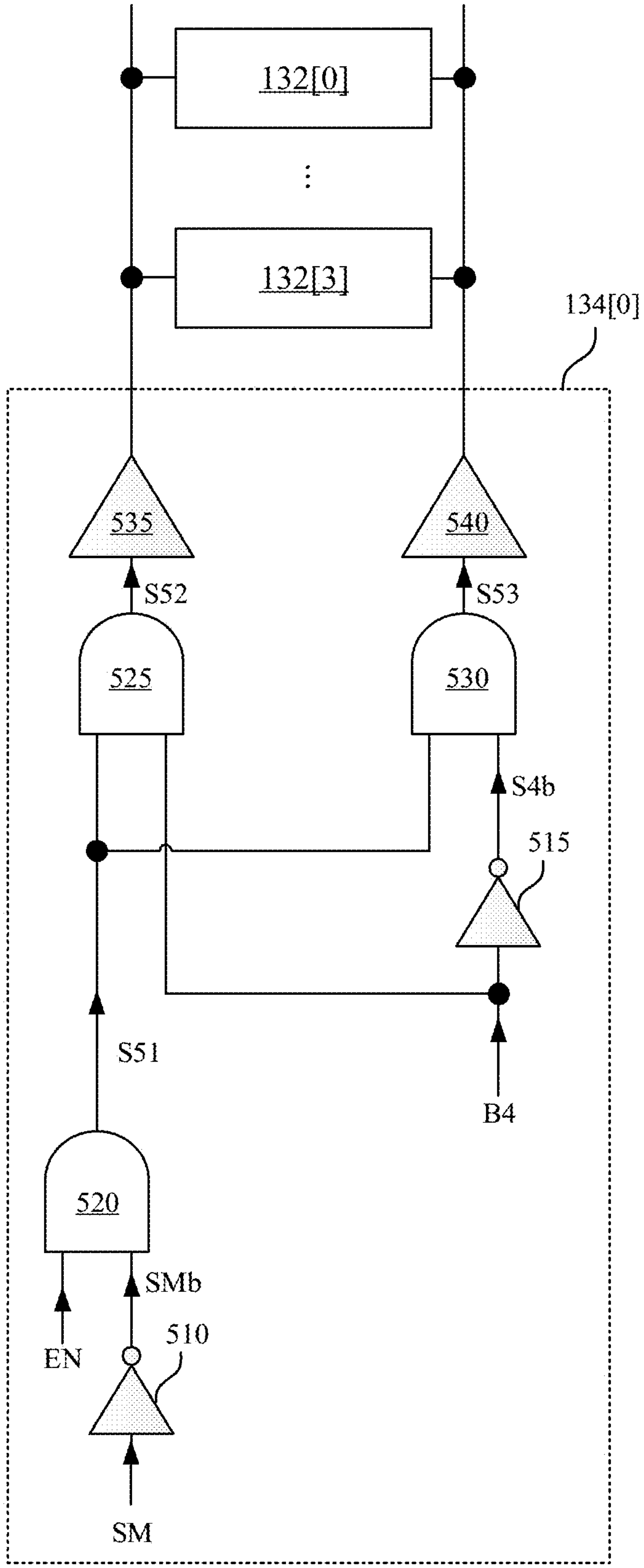
FIG. 5 illustrates a schematic diagram of the peripheral circuit in FIG. 1 according to some embodiments of the present disclosure.

FIG. 5 illustrates a schematic diagram of the peripheral circuit 134[0] in FIG. 1 according to some embodiments of the present disclosure. The peripheral circuit 134[0] includes an inverter circuit 510, an inverter circuit 515, logic gate circuits 520, 525, and 530, and buffer circuits 535 and 540. The inverter circuit 510 is configured to receive a mask bit SM and generate a signal SMb. The inverter circuit 515 is configured to receive the bit B4 and generate the signal S4b. The logic gate circuit 520 is configured to generate the signal S51 according to the enable signal EN and the signal SMb. The logic gate circuit 525 is configured to generate a signal S52 according to the signal S51 and the bit B4. The logic gate circuit 530 is configured to generate a signal S53 according to the signal S51 and the signal S4b. The buffer circuit 535 outputs the signal S52 to a search bit-line coupled to the content-addressable memory cells 132[0]-132[3] in the first column of FIG. 1. The buffer circuit 540 outputs the signal S53 to another search bit-line coupled to the content-addressable memory cells 132[0]-132[3] in the first column of FIG. 1. In some embodiments, each of the logic gate circuits 520, 525, and 530 may be an AND gate circuit, but the present disclosure is not limited thereto.

In some embodiments, the mask bit SM may be utilized to set whether to perform a data search based on the corresponding bit (e.g., bit B4). For example, if the mask bit SM is a logic value of 1, the bit B4 is not searched. Alternatively, if the mask bit SM is a logic value of 0, the bit B4 is searched. Similarly, when the enable signal EN is the logic value of 0, the signal S51 will have a logic 0 value, so that the subsequent circuits will all generate outputs with the logic value of 0, and the levels of the corresponding two search bit-lines will not be adjusted. Equivalently, the second data search performed by the peripheral circuit 134 [0] may be considered as not enabled. On the other hand, when both the enable signal EN and the signal SMb are the logic values of 1, the signal S51 will also have the logic value of 1. Under this condition, the outputs generated by the subsequent circuits may be the logic value of 1 or 0 (depending on the bit B4), thereby adjusting the levels of the corresponding two search bit-lines to perform the second data search.

Figure 6:
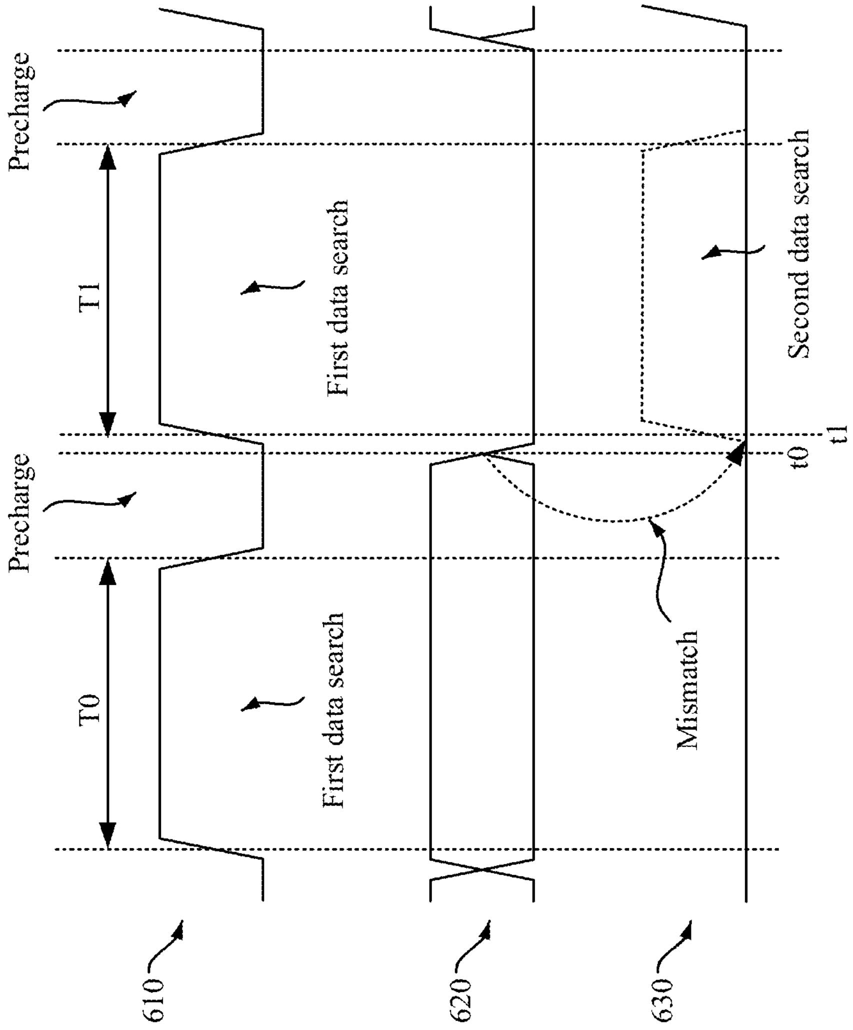
FIG. 6 illustrates an operation waveform diagram of the content-addressable memory in FIG. 1 according to some embodiments of the present disclosure.

FIG. 6 illustrates an operation waveform diagram of the content-addressable memory 100 in FIG. 1 according to some embodiments of the present disclosure. During a period T0, the pre-search content-addressable memory array 110 performs the first data search for the first time (as shown in waveform 610). During the period between the periods T0 and T1 (as shown in waveform 610), the pre-search content-addressable memory array 110 performs a precharge operation to charge the match lines M1[0]-M1[3]. During the period T1, the pre-search content-addressable memory array 110 performs the first data search for the second time (as shown in waveform 610). After the period T1, the pre-search content-addressable memory array 110 performs the precharge operation again to charge the match lines M1[0]-M1 [3].

At time t0, the driver circuit 140 outputs the result of the first data search performed during the period T0 (as shown in waveform 620). At time t1, if the result of the first data search is a mismatch, the main search content-addressable memory array 130 will not perform the second data search in response to the enable signal EN (as shown in waveform 630). Alternatively, if the result of the first data search is a match, the main search content-addressable memory array 130 will perform the second data search in response to the enable signal EN (as shown by the dashed waveform in waveform 630). As can be seen from FIG. 6, if the result of the first data search is a mismatch, the main search content-addressable memory array 130 will not perform the second data search, thereby saving overall power consumption.

Figure 7:
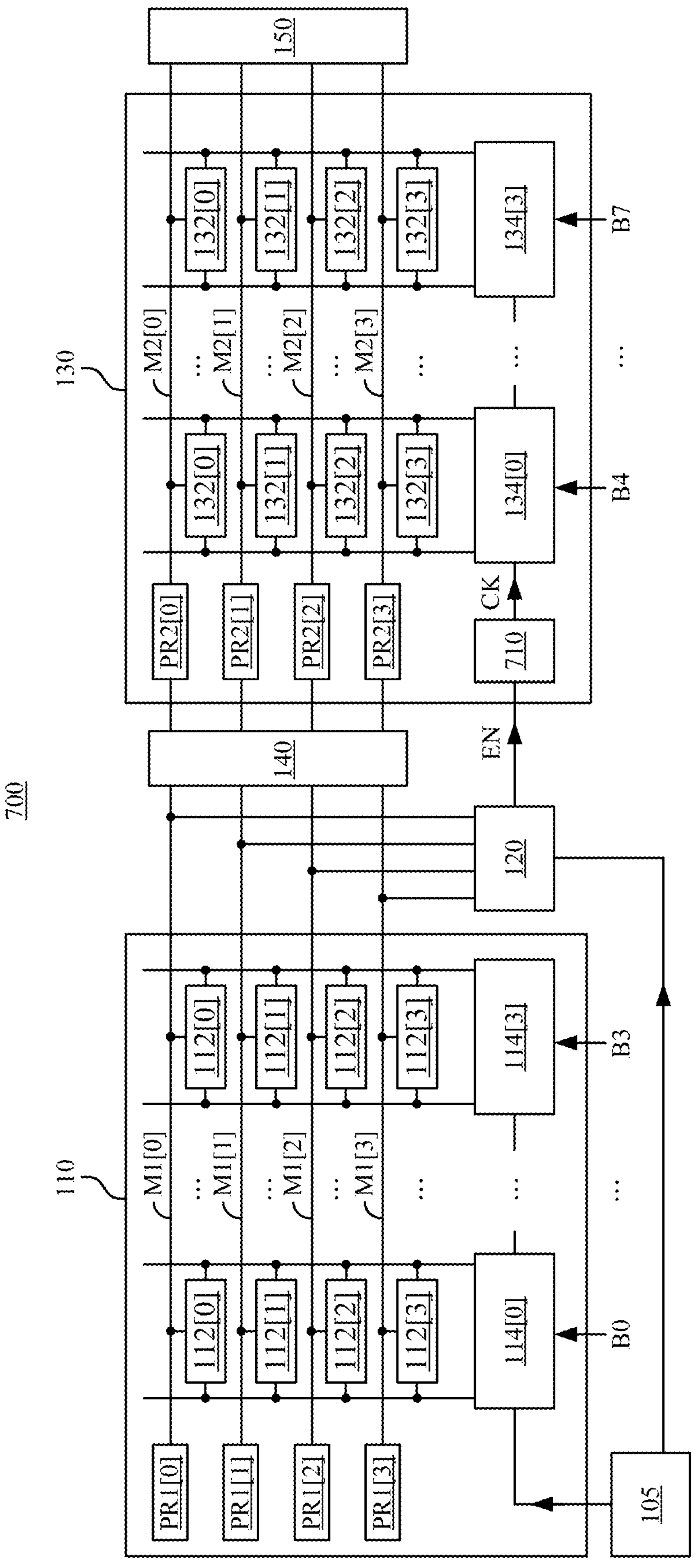
FIG. 7 illustrates a schematic diagram of a content-addressable memory according to some embodiments of the present disclosure.

FIG. 7 illustrates a schematic diagram of a content-addressable memory 700 according to some embodiments of the present disclosure. Different from examples in FIG. 1, in this example, the main search content-addressable memory array 130 further includes a timing controller circuit 710. The timing controller circuit 710 is configured to generate a clock signal CK according to the enable signal EN. The peripheral circuits 134[0]-134[3] are configured to perform the second data search according to the clock signal CK. In other words, in this example, if the result of the first data search is a mismatch, the timing controller circuit 710 is not enabled and does not generate the clock signal CK, so that the peripheral circuits 134[0]-134[3] do not perform the second data search, thereby saving overall power consumption. Alternatively, if the result of the first data search is a match, the timing controller circuit 710 is enabled and generates the clock signal CK, so that the peripheral circuits 134[0]-134[3] may perform the second data search.

It is understood that the numbers of circuits shown in FIGS. 1 to 7 are given for illustrative purposes. In different embodiments, the numbers of circuits in FIGS. 1 to 7 may be adjusted accordingly, and thus the present disclosure is not limited to the numbers of circuits shown in these figures.

Figure 8:
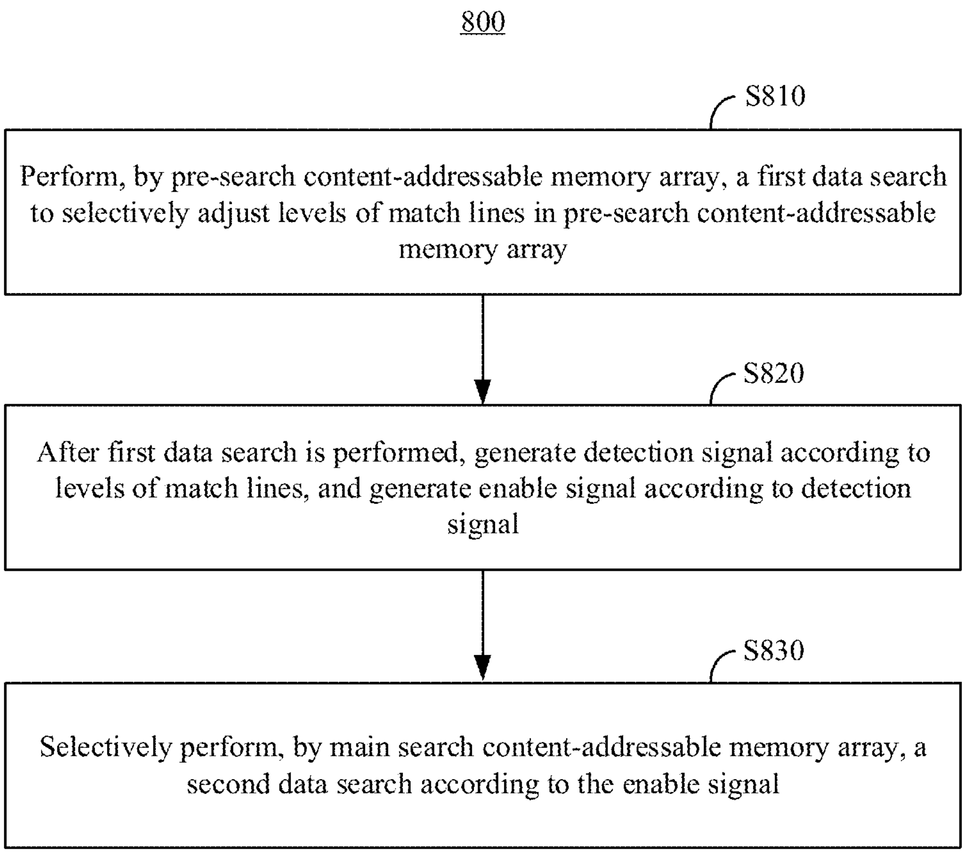
FIG. 8 illustrates a flowchart of a memory control method according to some embodiments of the present disclosure.

FIG. 8 illustrates a flowchart of a memory control method 800 according to some embodiments of the present disclosure. In operation S810, a first data search is performed by a pre-search content-addressable memory array to selectively adjust levels of the match lines in the pre-search content-addressable memory array. In operation S820, after the first data search is performed, a detection signal is generated according to the levels of the match lines, and an enable signal is generated according to the detection signal. In operation S830, a second data search is selectively performed by main search content-addressable memory array according to the enable signal.

Operations of the memory control method 800 can be understood with reference to the above embodiments, and thus the repetitious descriptions are not further given. The above operations of the memory control method 800 include exemplary operations, but those operations are not necessarily performed in the order described above. Operations of the memory control method 800 may be added, replaced, changed order, and/or eliminated, or the operations of the memory control method 800 may be performed simultaneously or partially simultaneously as appropriate, in accordance with the spirit and scope of various embodiments of the present disclosure.

As described above, the content-addressable memory and memory control method provided in some embodiments of the present disclosure may determine whether to enable the peripheral circuits in the main memory array based on the data search result of the pre-search, thereby selectively charging and discharging the search bit-lines in the main memory array. Thus, overall power consumption may be further reduced. In some applications, the content-addressable memory and memory control method provided in some embodiments of the present disclosure may further combine the control mechanism for reducing the power consumption caused by the match lines, thereby further reducing overall power consumption.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A content-addressable memory, comprising:

a pre-search content-addressable memory array configured to perform a first data search to selectively adjust levels of a plurality of match lines in the pre-search content-addressable memory array;

a control circuit configured to generate a detection signal according to the levels of the plurality of match lines after the first data search is performed, and to generate an enable signal according to the detection signal; and a main search content-addressable memory array configured to selectively perform a second data search according to the enable signal, wherein the main search content-addressable memory array comprises:

a timing controller circuit configured to selectively generate a clock signal according to the enable signal; and a plurality of peripheral circuits configured to perform the second data search according to the clock signal.

2. The content-addressable memory of claim 1, wherein the control circuit comprises:
a first logic gate circuit configured to generate the detection signal according to the levels of the plurality of match lines; and
a second logic gate circuit configured to generate the enable signal according to the detection signal and a control signal from the timing controller circuit.

3. The content-addressable memory of claim 2, wherein when a result of the first data search is a mismatch, the first logic gate circuit generates the detection signal with a predetermined level, and the second logic gate circuit generates the enable signal with a disable level in response to the detection signal with the predetermined level, such that the main search content-addressable memory array does not perform the second data search.

4. The content-addressable memory of claim 2, wherein the first logic gate circuit is an OR gate circuit.

5. The content-addressable memory of claim 2, wherein the second logic gate circuit is an AND gate circuit.

6. The content-addressable memory of claim 1, wherein the control circuit is further configured to reset a level of the detection signal according to a reset signal before the first data search is performed.

7. A content-addressable memory, comprising:
a pre-search content-addressable memory array configured to perform a first data search to selectively adjust levels of a plurality of match lines in the pre-search content-addressable memory array;
a control circuit configured to generate a detection signal according to the levels of the plurality of match lines after the first data search is performed, and to generate an enable signal according to the detection signal; and
a main search content-addressable memory array configured to selectively perform a second data search according to the enable signal,
wherein the control circuit comprises:
a first switch configured to be turned on according to a reset signal to transmit a voltage to a first node;
a second switch configured to be turned on according to the level of one of the plurality of match lines;
a third switch configured to be turned on according to the reset signal to couple the first node to ground through the second switch;
an inverter circuit configured to generate the detection signal according to a level of the first node; and
a logic gate circuit configured to generate the enable signal according to the detection signal and a control signal from a timing controller circuit.

8. The content-addressable memory of claim 7, wherein the first switch is implemented with a P-type transistor, and each of the second switch and the third switch is implemented with an N-type transistor.

9. The content-addressable memory of claim 1, wherein the control circuit comprises:
an inverter circuit configured to generate a first signal according to the level of one of the plurality of match lines;
a first switch configured to be turned on according to the first signal to transmit a voltage;
a second switch configured to be turned on according to a reset signal to transmit the voltage to a first node to generate the detection signal;
a third switch configured to be turned on according to the reset signal to pull down a level of the first node to ground; and
a logic gate circuit configured to generate the enable signal according to the detection signal and a control signal from the timing controller circuit.

10. The content-addressable memory of claim 9, wherein each of the first switch and the second switch is implemented with an P-type transistor, and the third switch is implemented with an N-type transistor.

11. The content-addressable memory of claim 1, wherein the first data search corresponds to a portion of bits in search data, and the second data search corresponds to another portion of bits in the search data.

12. A memory control method, comprising:
performing, by a pre-search content-addressable memory array, a first data search to selectively adjust levels of a plurality of match lines in the pre-search content-addressable memory array;
generating a detection signal according to the levels of the plurality of match lines after the first data search is performed, and generating an enable signal according to the detection signal; and
selectively performing a second data search by a main search content-addressable memory array according to the enable signal,
wherein the main search content-addressable memory array comprises a timing controller circuit and a plurality of peripheral circuits, and selectively performing the second data search by a main search content-addressable memory array according to the enable signal comprises:
selectively generating, by the timing controller circuit, a clock signal according to the enable signal; and
performing, by the plurality of peripheral circuits, the second data search according to the clock signal.

13. The memory control method of claim 12, wherein generating the detection signal according to the levels of the plurality of match lines after the first data search is performed, and generating the enable signal according to the detection signal comprises:
generating, by a first logic gate circuit, the detection signal according to the levels of the plurality of match lines; and
generating, by a second logic gate circuit, the enable signal according to the detection signal and a control signal from the timing controller circuit.

14. The memory control method of claim 13, wherein the first logic gate circuit is an OR gate circuit, and the second logic gate circuit is an AND gate circuit.

15. The memory control method of claim 13, wherein when a result of the first data search is a mismatch, the first logic gate circuit generates the detection signal with a predetermined level, and the second logic gate circuit generates the enable signal with a disable level in response to the detection signal with the predetermined level, such that the main search content-addressable memory array does not perform the second data search.

16. The memory control method of claim 12, further comprising:
resetting a level of the detection signal according to a reset signal before the first data search is performed.

17. The memory control method of claim 12, wherein generating the detection signal according to the levels of the plurality of match lines after the first data search is performed, and generating the enable signal according to the detection signal comprises:
turning on a first switch according to a reset signal to transmit a voltage to a first node;

turning on a second switch according to the level of one of the plurality of match lines;

turning on a third switch according to the reset signal to couple the first node to ground through the second switch;

generating, by an inverter circuit, the detection signal according to a level of the first node; and generating, by a logic gate circuit, the enable signal according to the detection signal and a control signal from the timing controller circuit.

18. The memory control method of claim 12, wherein generating the detection signal according to the levels of the plurality of match lines after the first data search is performed, and generating the enable signal according to the detection signal comprises:

generating, by an inverter circuit, a first signal according to the level of one of the plurality of match lines;

turning on a first switch according to the first signal to transmit a voltage;

turning on a second switch according to a reset signal to transmit the voltage to a first node to generate the detection signal;

turning on a third switch according to the reset signal to pull down a level of the first node to ground; and generating the enable signal by a logic gate circuit according to the detection signal and a control signal from the timing controller circuit.

* * * * *